United States Patent
Krishnamurthy et al.

(10) Patent No.: US 10,664,637 B2
(45) Date of Patent: May 26, 2020

(54) TESTBENCH RESTORATION BASED ON CAPTURE AND REPLAY

(71) Applicant: Mentor Graphics Corporation, Wilsonville, OR (US)

(72) Inventors: Suresh Krishnamurthy, Noida (IN); Ruchir Prakash, Fremont, CA (US); Jeffrey W. Evans, Dripping Springs, TX (US); Deepak Kumar Garg, Noida (IN)

(73) Assignee: Mentor Graphics Corporation, Wilsonville, OR (US)

( * ) Notice: Subject to any disclaimer, the term of this patent is extended or adjusted under 35 U.S.C. 154(b) by 1046 days.

(21) Appl. No.: 14/981,524

(22) Filed: Dec. 28, 2015

(65) Prior Publication Data
US 2017/0185710 A1    Jun. 29, 2017

(51) Int. Cl.
*G06F 9/455* (2018.01)
*G06F 30/331* (2020.01)

(52) U.S. Cl.
CPC .................................. *G06F 30/331* (2020.01)

(58) Field of Classification Search
CPC .................................................. G06F 17/5027
USPC .................................................. 703/23
See application file for complete search history.

(56) References Cited

U.S. PATENT DOCUMENTS

| | | | |
|---|---|---|---|
| 6,061,511 A | 5/2000 | Marantz | |
| 6,175,946 B1 * | 1/2001 | Ly | G06F 17/5022 703/14 |
| 7,480,610 B2 | 1/2009 | Scott | |
| 8,843,861 B2 | 9/2014 | Selvidge | |
| 9,317,629 B1 * | 4/2016 | Koh | G06F 11/3668 |
| 2007/0204137 A1 * | 8/2007 | Tran | G06F 9/30181 712/214 |
| 2007/0219772 A1 * | 9/2007 | Kfir | G06F 17/5022 703/25 |
| 2013/0318484 A1 * | 11/2013 | Selvidge | G06F 17/505 716/102 |

* cited by examiner

*Primary Examiner* — Andre Pierre Louis

(57) ABSTRACT

Messages transmitted from an emulator to a testbench of a part of the testbench are recorded from a starting point of an emulation operation to a checkpoint of the emulation operation. State information of the emulator at the checkpoint is captured and stored. The emulator is then configured to a state corresponding to the checkpoint based on the stored state information, and the testbench or the part of the testbench is restored to the checkpoint by running the testbench or the part of the testbench based on the recorded messages.

18 Claims, 4 Drawing Sheets

Flow chart
300

Flow chart
300

TESTBENCH RESTORATION BASED ON CAPTURE AND REPLAY

FIELD OF THE DISCLOSED TECHNOLOGY

The present disclosed technology relates to the field of circuit design verification technology. Various implementations of the disclosed technology may be particularly useful for hardware emulation that employs a software testbench or a software testbench component.

BACKGROUND OF THE DISCLOSED TECHNOLOGY

Modern integrated circuit designs have become extremely complex. As a result, various techniques have been developed to verify that circuit designs will operate as desired before they are implemented in an expensive manufacturing process. For example, logic simulation is a tool used for verifying the logical correctness of a hardware design. Designing hardware today involves writing a program in the hardware description language. A simulation may be performed by running that program. If the program runs correctly, then one can be reasonably assured that the logic of the design is correct at least for the cases tested in the simulation.

Software-based simulation, however, may be too slow for large complex designs such as SoC (System on Chip) designs. The speed of execution of a simulator drops significantly as the design size increases due to cache misses and memory swapping. Hardware emulation provides an effective way to increase verification productivity. It is based on an actual silicon implementation and performs circuit verification generally in parallel as the circuit design will execute in a real device. By contrast, a simulator performs circuit verification by executing the hardware description code serially. The different styles of execution can lead to orders of magnitude differences in execution time.

Two categories of emulators have been developed. The first category is programmable logic or FPGA (field programmable gate array)-based. In an FPGA-based architecture, each chip (either a commercial FPGA chip or a custom FPGA chip) has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route is performed on the FPGA chips in a way that preserves the connectivity in the original circuit design. The programmable logic chips employed by an emulator may be commercial FPGA chips or custom-designed emulation chips containing programmable logic blocks.

The second category of emulators is processor-based: an array of Boolean processors able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor.

An emulator may operate in various modes. In an in-circuit emulation mode, the emulator is connected with a user's target system to form a prototype of the system the user is designing. The emulator typically replaces the circuit being designed for the target system, allowing system-level and software testing prior to silicon availability. Although an emulator may run up to six orders of magnitude faster than a simulator, it is not fast enough to run at the same speed of the physical target system (a few megahertz vs hundreds of megahertz). Speed rate adapters are often introduced between the target system and the emulator. A rate adapter behaves like a buffer. It caches the signal activity from the design-under-test (DUT) at emulation speed and sends it at real-time speed to the target system. Conversely, it captures the signal activity from the target system at full speed, caches it, and then sends it back to the DUT at emulation speed. Even when a rate adapter is available, the constant evolution of speed and complexity of individual I/O protocols has made timely rate adapter development difficult.

In an acceleration mode, the physical target system is replaced by a virtual target system modelled via one of the high-level languages such as SystemVerilog, SystemC, or C++. The acceleration mode leverages the existing simulation testbench and removes the need for external rate adapters. The testbench creates test vectors and check corresponding responses of the circuit model. In addition to the elimination of speed adapters, the acceleration mode has advantages such as no hardware dependencies, the ability to use the emulator remotely, and the ability to run verification of corner cases.

The acceleration mode can be cycle-based or transaction-based. The cycle-based acceleration mode employs a signal-level or bit-level interface connecting the testbench processed by the host workstation to the design mode on the emulator. Each and every transition on each and every interface signal must be transferred between the testbench and the design model at the slow speed of the testbench simulated in the workstation. As a result, the speed of the emulator is wasted waiting to carry out these signal transfers.

The transaction-based acceleration reduces the traffic between workstation and emulator by replacing bit-by-bit exchanges with transaction exchanges. Data exchange through the transaction-level interface is infrequent and information-rich and high frequency pin activity is confined to run at full emulator clock rates. The transaction-level interface may be designed for small packets of data and fast streaming speed unlike the interface for loading the circuit model.

Transactors are used to facilitate the communication by mapping high-level commands (transactions) from the testbench into the signal-level, protocol-specific sequences (bit-by-bit operations) required by the design model on the emulator. A transactor typically consists of a front-end proxy interface, a back-end RTL (register-transfer level) bus-functional model, and a physical communications channel. The front-end interface is typically a behavioral model that runs on the workstation and interfaces to the testbench through Direct Programming Interface (DPI) calls. It is often written in C/C++, SystemC, or System Verilog. This front-end interface sends and receives high-level commands at the transactional level across the physical high-performance communication channel such as PCI Express using the Standard Co-Emulation Modeling Interface (SCEMI) standard or some variation of it. The back-end RTL bus-functional model runs on the emulator and interfaces with the communication channel to send and receive transactions, and converts transactions to bit-level signals for the design model. Because the back-end RTL bus-functional model is mapped inside the emulator, it can execute at the same speed of an in-circuit emulation system.

If the testbench is synthesizable—that is, it is an RTL testbench—it can be mapped onto an emulator, thereby removing all dependencies on the outside world. This embedded testbench acceleration mode can take full advantage of the intrinsic performance of the emulator and achieve the highest speed of execution. Unfortunately, only few verification teams write synthesizable testbenches, limiting drastically this deployment method. It is also a very restrictive environment as every time the test needs to be changed, a recompile has to be performed, which could be many hours depending upon design size. A variation is to divide a testbench into a hardware part and a software part: synthesizable testbench components like drives, monitors etc. are synthesized into real hardware and run inside the emulator together with the circuit model, while other non-synthesizable testbench components like generators, scoreboards, coverage collectors etc. remain in software and are simulated in the workstation.

Today, the majority of designs fall under the category of embedded SoC designs. These designs include at least one microprocessor (multiple cores are becoming popular) and massive amounts of embedded software loaded into on-board memories. The software ranges from operating systems to drivers, apps, diagnostics, and even special-purpose testing programs.

It should be appreciated by an ordinary person skill in the art that it is possible to mix different modes, such as processing embedded software together with a virtual testbench driving the design-under-test via verification IP or even in ICE mode.

Modern circuit designs often require a lengthy initialization period prior to performing normal functions. For example, a central processing unit (CPU) typically has an initial "boot sequence" that must be completed each time the CPU is turned on. Once the boot sequence is completed, the CPU can be used to process instructions or transactions. Accordingly, a verification test of the CPU cannot be performed until after the boot sequence is completed. At a typical clock speed of the CPU (e.g., a few GHz) the boot sequence may be completed within a minute. At a typical clock speed of an emulator (e.g., a few MHz), however, the boot sequence may last for a few hours. It will significantly speed up the verification process if both of the emulator and the testbench can be restored to a post-boot-sequence state directly without going through the lengthy initialization process.

The restoration can also help to speed up debugging processes. If a problem occurs in the middle of a long test process, the state of the system may be restored right before the problem occurs and debugging can be performed without waiting for the design model to run from the very beginning of the test.

BRIEF SUMMARY OF THE DISCLOSED TECHNOLOGY

Aspects of the disclosed technology relate to techniques for testbench restoration based on capture and replay. In one aspect, there is a method comprising: recording messages transmitted from an emulator to a testbench or a part of the testbench from a starting point of an emulation operation to a checkpoint of the emulation operation; capturing and storing state information of the emulator at the checkpoint, the state information comprising signal values of state elements at the checkpoint; configuring the emulator to a state corresponding to the checkpoint based on the stored state information; and restoring the testbench or the part of the testbench to the checkpoint by running the testbench or the part of the testbench based on the recorded messages.

The method may further running the emulator along with the testbench or the part of the testbench starting from the checkpoint. Alternatively or additionally, the method may further comprise recording output messages transmitted from the testbench or the part of the testbench to the emulator from the starting point of the emulation operation to the checkpoint of the emulation operation; and comparing output messages transmitted from the testbench or the part of the testbench to the emulator during the restoring with the recorded output messages.

The testbench or the part of the testbench may be a standalone software model, a set of multiple connected software models, a testbench running on a software simulator, or a system including one or more connected software models and a testbench running on a software simulator.

A verification model implemented in the emulator may represent a design of a processor, and the emulation operation performed by the verification model between the start-ing pointing and the checkpoint comprises a booting process of the processor.

The recorded messages may not include messages transmitted to another part of the testbench that is mapped to the emulator.

In another aspect, there is a system comprising an emulator and a workstation coupled to the emulator, the system being configured to perform the above method, wherein the testbench or the part of the testbench is implemented by the workstation.

In still another aspect, there is a method, comprising: configuring an emulator to a state corresponding to a checkpoint of an emulation operation based on stored state information of the emulator, wherein the stored state information is captured and stored at the checkpoint during performing the emulation operation; and restoring a testbench or a part of the testbench to the checkpoint by running the testbench or the part of the testbench based on recorded messages, wherein the recorded messages are messages transmitted from the emulator to the testbench or the part of the testbench from a starting point of the emulation operation to the checkpoint of the emulation operation and are recorded during the performing the emulation operation.

The method may further running the emulator along with the testbench or the part of the testbench starting from the checkpoint. Alternatively or additionally, the method may further comprise recording output messages transmitted from the testbench or the part of the testbench to the emulator from the starting point of the emulation operation to the checkpoint of the emulation operation; and comparing output messages transmitted from the testbench or the part of the testbench to the emulator during the restoring with the recorded output messages.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Various aspects of the present disclosed technology relate to techniques for testbench restoration based on capture and replay. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers (e.g., by one or more servers in a cloud-computing environment).

The detailed description of a method or a device sometimes uses terms like "record," "store" and "configure" to describe the disclosed method or the device function/structure. Such terms are high-level abstractions. The actual operations or functions/structures that correspond to these terms will vary depending on the particular implementation and are readily discernible by one of ordinary skill in the art.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Illustrative Emulation System

Figure 1A:
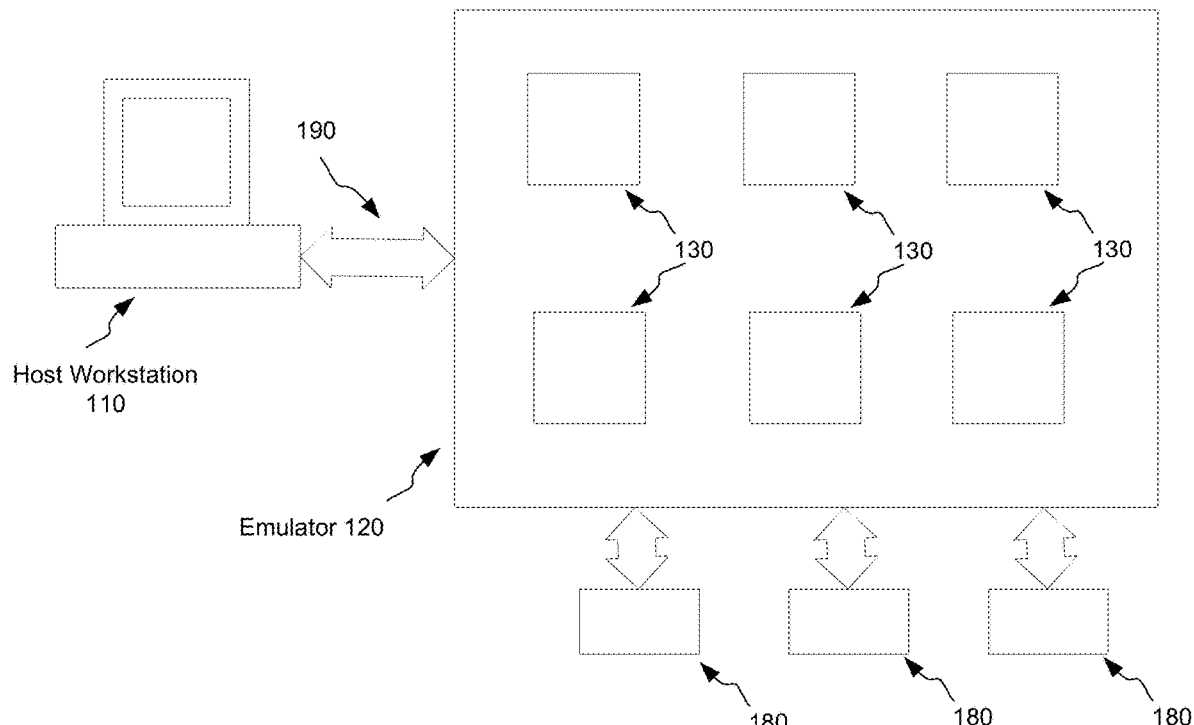
FIG. 1A shows an illustrative example of an emulation system with an emulator being coupled to targets.

FIG. 1A shows an illustrative example of an emulation system. As seen in this figure, the emulation system includes an emulator 120 coupled to a host workstation 110. The host workstation may be implemented by one or more computing systems. One computing system may include a single computer or multiple computers (e.g., a master computer and a plurality of slave computers). The workstation provides the capability to load the DUV (design under verification, also referred to as DUT—design under test) model into the emulator, controls the execution of the DUT model on the emulator over time, and serves as a debugging interface into the DUV model on the emulator. As discussed previously, the workstation may include the testbench and perhaps other software models in some of the operational modes.

The emulator 120 includes multiple printed circuit boards (emulation circuit boards) 130. These emulation circuit boards 130 are networked (not shown). A circuit design may be partitioned by the host workstation 110 and loaded to the emulation circuit boards 130 for emulation.

In the in-circuit emulation mode, one or more targets 180 are coupled to the emulator 120 in FIG. 1A. In some simple environments, a target may be a piece of test equipment that generates and verifies test data such as a network tester. In other environments, the target can be the actual circuitry with which the DUT model will interact in its final application (e.g., other hardware components of the system for which the DUT model is designed). A target can be either a static target or a dynamic target, depending on whether design clock signals run in the emulator can be suspended or not.

Figure 1B:
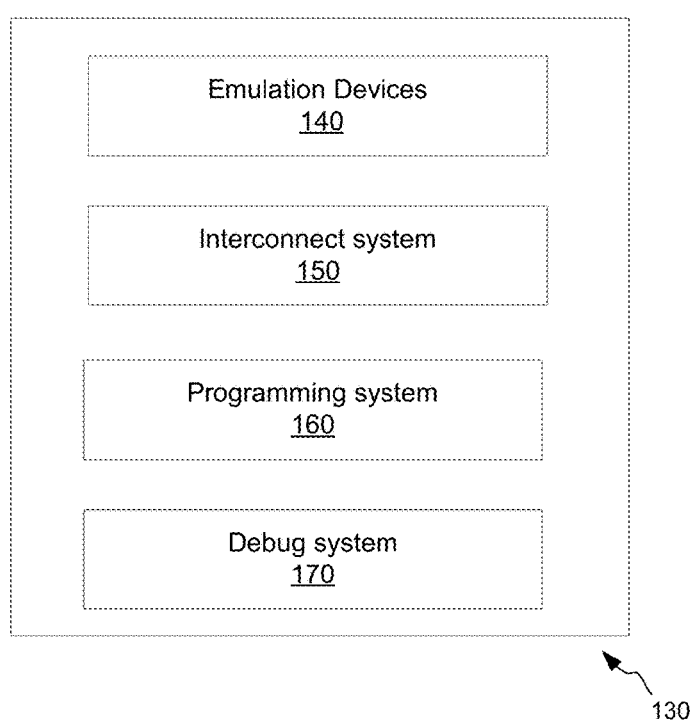
FIG. 1B shows an illustrative example of an emulation circuit board.

FIG. 1B illustrates an example of an emulation circuit board 130. The emulation circuit board 130 includes an array of emulation devices 140. The emulation devices 140 can be programmed to model, for example, combinatorial logic components, sequential circuit components and memories. The emulation devices 140 may be processor-based or FPGA-based.

Also included in the emulation circuit board 130 are an interconnect system 150, a programming system 160, and a debug system 170. The interconnect system 150 allows data to be moved between emulation devices 140. A portion of a circuit design on one emulation device may need data computed by another portion of the design on another emulation device. The programming system 160 enables a variety of other types of data to be brought in or out from an emulation device 140. Examples include programming data to configure an emulation device to perform a particular function, visibility data collected from the debug system 170 to be brought to the host workstation 110 for display, and content data either read from or written to memory circuitry in an emulation device 140. The debug system 170 enables the emulation system to monitor the behavior of a modeled circuit design. Needed data for visibility viewing purposes can be stored in the debug system 170. The debug system 170 may also provide resources for detecting specific conditions occurring in the circuit design. Such condition detection is sometimes referred to as triggering.

The emulator 120 is coupled to the host workstation 110 through an interface system 190. The interface system 190 comprises one or more interfaces. A typical interface is optimized to transport large amounts of data such as data containing the emulated circuit design model, initial contents of registers and design memories and data for debugging purposes. When this interface is in use, both the emulator infrastructure clock and the design clocks are typically stopped. This interface is, however, sub-optimal to transfer smaller sizes of data due to high fixed cost for every transfer.

With various implementations of the disclosed technology, the interface system may also comprise one or more interfaces designed for small packets of data and fast streaming speed. The speed may be, for example, in the order of 2-3 Gigabits per second. These interfaces may be employed during the capture mode, the replay mode, or both, as will be discussed in detail below. The communication may be performed through instrumented logic in the emulator model, which requires the emulator infrastructure clock keep running even though the design clocks can be stopped.

It should also be appreciated that the emulation system in FIG. 1A and the emulation circuit board 130 in FIG. 1B are illustrated as examples only, and they are not intended to be limiting. Various embodiments of the disclosed technology may be implemented using only a subset of the components illustrated in the figures, or include an alternate combination of components, including components that are not shown in the figures.

Figure 2:
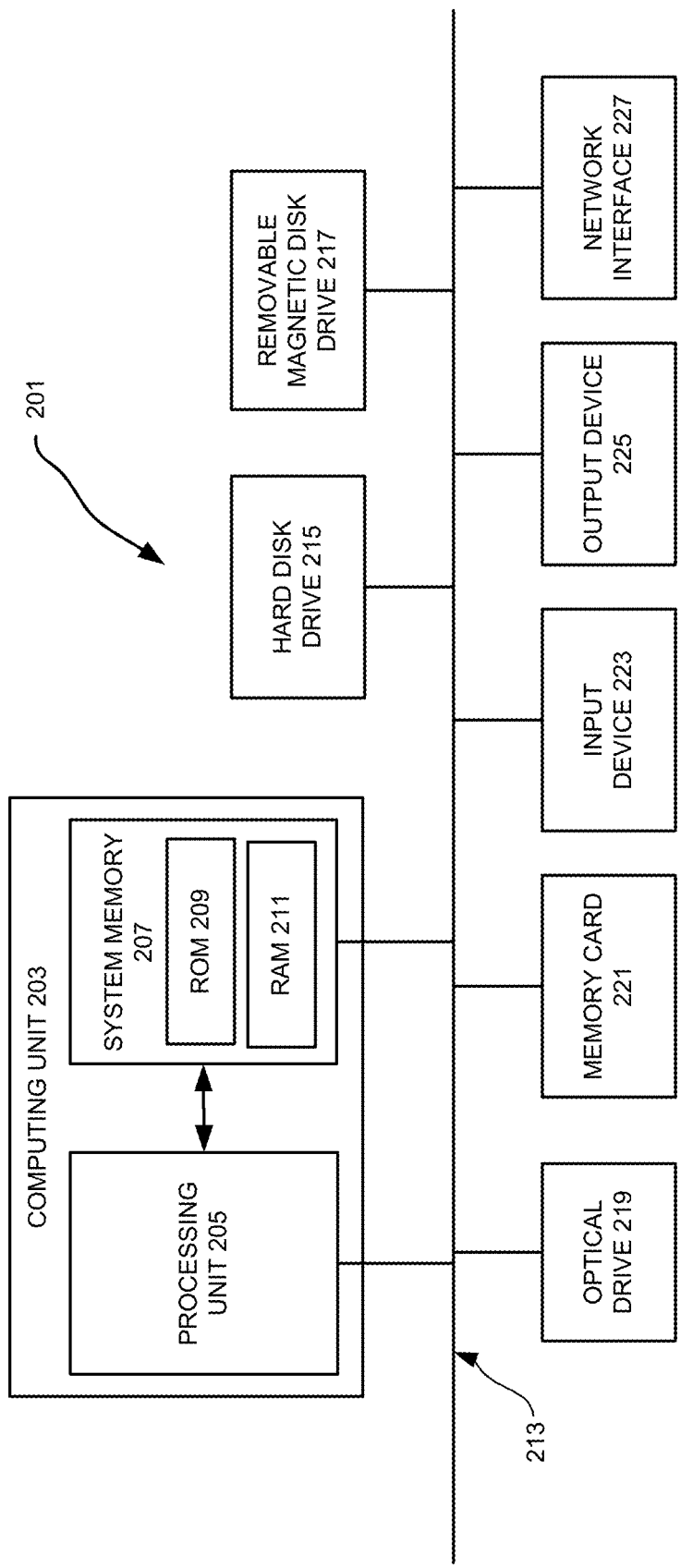
FIG. 2 illustrates a programmable computer system with which various embodiments of the disclosed technology may be employed.

FIG. 2 shows an illustrative example of a computing device 201 that may serve as the workstation 110. As seen in this figure, the computing device 201 includes a computing unit 203 with a processing unit 205 and a system memory 207. The processing unit 205 may be any type of programmable electronic device for executing software instructions, but will conventionally be a microprocessor. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a "hard" magnetic disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers. With various examples of the computer 201, one or more of the peripheral devices 215-225 may be internally housed with the computing unit 203. Alternately, one or more of the peripheral devices 215-225 may be external to the housing for the computing unit 103 and connected to the bus 213 through, for example, a Universal Serial Bus (USB) connection.

With some implementations, the computing unit 203 may be directly or indirectly connected to one or more network interfaces 227 for communicating with other devices making up a network. The network interface 227 translates data and control signals from the computing unit 203 into network messages according to one or more communication protocols, such as the transmission control protocol (TCP) and the Internet protocol (IP). Also, the interface 227 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 201 is illustrated as an example only, and it not intended to be limiting. Various embodiments of the disclosed technology may be implemented using one or more computing devices that include the components of the computer 201 illustrated in FIG. 2, which include only a subset of the components illustrated in FIG. 2, or which include an alternate combination of components, including components that are not shown in FIG. 2. For example, various embodiments of the disclosed technology may be implemented using a multiprocessor computer, a plurality of single and/or multiprocessor computers arranged into a network, or some combination of both.

Testbench Restoration

Figure 3:
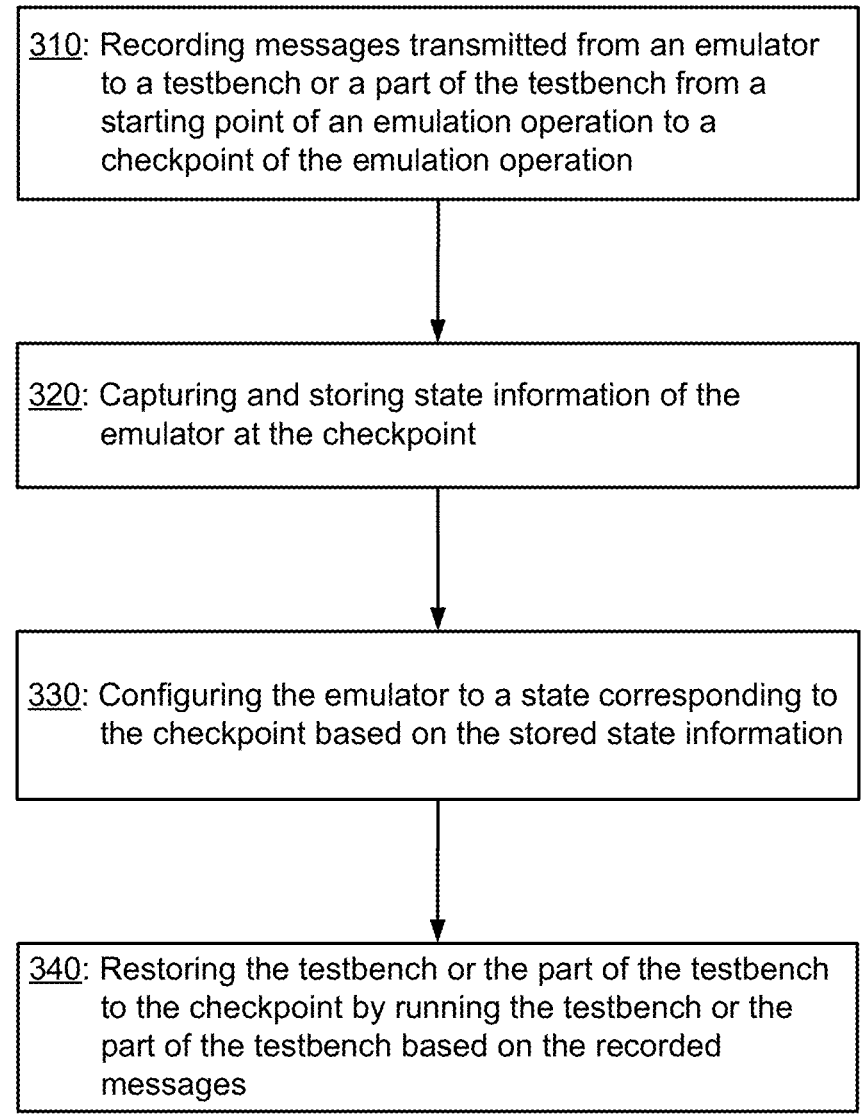
FIG. 3 illustrates a flow chart describing methods for testbench restoration based on capture and replay that may be employed by various embodiments of the disclosed technology.
Figure 3:

FIG. 3 illustrates a flow chart 300 describing methods for testbench restoration based on capture and replay that may be employed by various embodiments of the disclosed technology. For ease of understanding, the flow chart 300 will be described with reference to the emulator system illustrated in FIG. 1A. It should be appreciated, however, that alternate implementations of an emulator system may be used to perform the method of testbench restoration based on capture and replay shown in the flow chart 300 according to various embodiments of the disclosed technology. In addition, it should be appreciated that implementations of the emulator system illustrated in FIG. 1A may be employed with other methods of testbench restoration based on capture and replay according to different embodiments of the disclosed technology.

In operation 310 of the flowchart 300, messages transmitted from an emulator to a testbench or a part of the testbench are recorded from a starting point of an emulation operation to a checkpoint of the emulation operation. The messages may be stored in the workstation where the testbench or the part of the testbench is running or a standalone device. The testbench or the part of the testbench may be a standalone software model, a set of multiple connected software models, a testbench running on a software simulator, or a system including one or more connected software models and a testbench running on a software simulator. With some implementations of the disclosed technology, the messages stored do not include messages transmitted to another part of the testbench. This part of the testbench may be the part mapped to the emulator. The restoration of this part is based on state information to be stored as discussed below.

Figure 4:
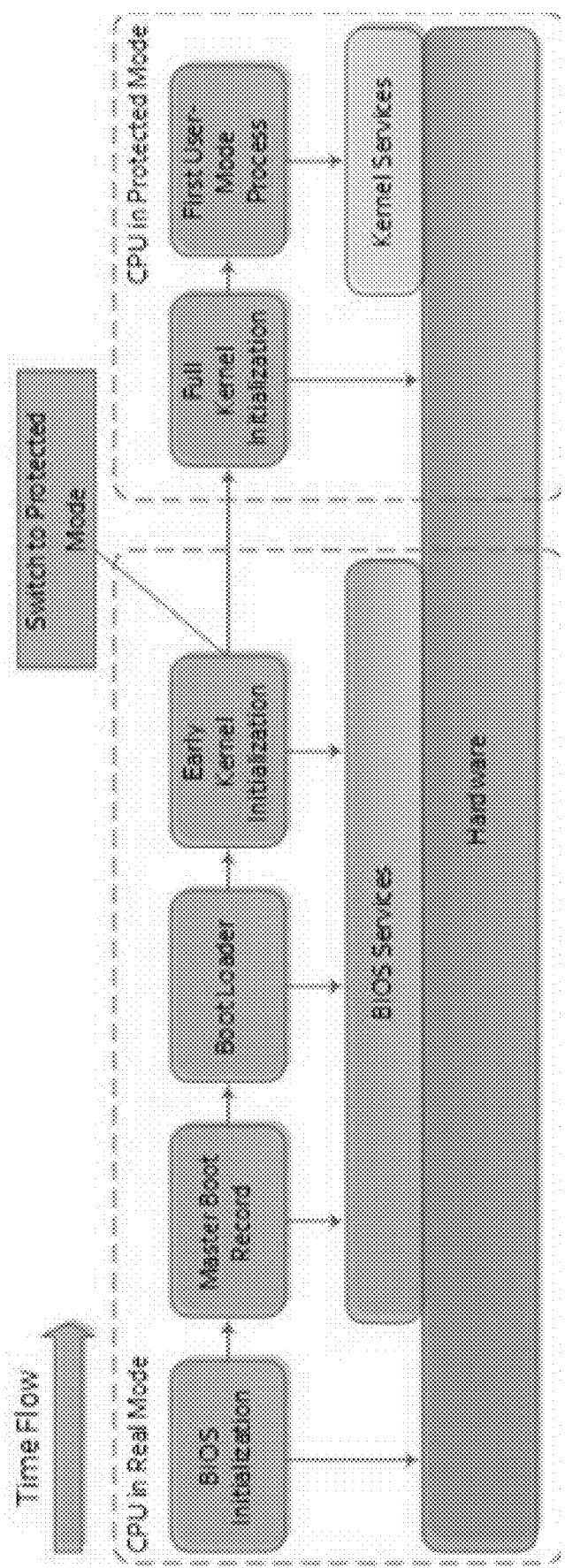
FIG. 4 illustrates an example of a processor boot sequence.

The verification model implemented in the emulator may represent a design of a processor, and an emulation operation performed by the verification model between the starting pointing and the checkpoint may comprise a booting process of the processor. FIG. 4 illustrates an example of the booting process. As discussed previously, the booting process may last for a few hours at a typical clock speed of an emulator (e.g., a few MHz). The check point may be a time point right after the booting process or a time point right before a problem of the design-under-test occurs.

In operation 320, state information of the emulator at the checkpoint is captured and stored. A design usually contains combinational logic and state elements. Combination logic produces outputs based purely on the input signals. State elements, on the other hand, "remember" their input signal values. If state element signal values at a specific time point is captured and stored, the circuit can be restored to the state at that specific time point directly by loading the stored state element signal values to corresponding state elements.

The state information of the emulator may include state element signal values not only for the state elements associated with the design-under-test but also for those associated with a part of the testbench if that part of the testbench is mapped to the emulator.

A typical verification process includes multiple emulation operations. For example, when problems occur in one emulation operation, one or more additional emulation operations are needed for debugging purposes. The information derived from operations 310 and 320 allows the emulator and the testbench or the part of the testbench to operate from the checkpoint while performing the one or more additional emulation operations. The next two operations restore the emulator and the testbench or the part of the testbench to the checkpoint, respectively.

In operation 330, the emulator is configured to a state corresponding to the checkpoint based on the stored state information. The configuration of the emulator comprises loading stored state element signal values to state elements in the emulator. Commercial emulators such as the ones available from Mentor Graphics, Wilsonville, Oreg., have the capability of performing the operations 320 and 330.

In operation 340, the testbench or the part of the testbench is restored to the checkpoint by running the testbench or the part of the testbench based on the recorded messages. In a typical emulation operation, the testbench receives/sends messages from/to the emulator. During the restoration, however, the testbench does not need to communicate with the emulator. The testbench advances to the checkpoint by using the recorded messages. The speed of this operation is mainly dependent upon the speed of executing file Input/Output. This can be much faster than through a normal emulation operation because the speed of the emulator is in the range of a few MHz while the speed of the workstation operating alone can reach the GHz range.

The output messages transmitted from the testbench to the emulator may also be recorded from the starting point of the first emulation operation to the checkpoint of the first emulation operation. Then output messages generated from the restoring may be compared with the recorded output messages to ensure that the restoration of the testbench is executed correctly.

If a part of the testbench is mapped to the emulator, the restoration of the testbench may further be based on the stored state information of the part of the testbench. The restoration of the part of the testbench may be accomplished in operation 330.

After both the design-under-test and the testbench are restored to the state corresponding to the checkpoint, one or more emulation operations may be performed. If the design-under-test comprises a processor, this allows the time-consuming booting sequence to be skipped. When debugging of a problem occurring a long way into a test, the emulation system can also be restored to the state right before the problem occurs and debugging can be conducted promptly.

Conclusion

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, comprising:
   recording messages transmitted from an emulator to a testbench or a part of the testbench from a starting point of an emulation operation to a checkpoint of the emulation operation, wherein the emulator is loaded with a design under verification (DUV) and the testbench or part of the testbench is separate from the DUV;
   capturing and storing state information of the emulator at the checkpoint, the state information comprising signal values of state elements at the checkpoint;
   configuring the emulator to a state corresponding to the checkpoint based on the stored state information; and
   restoring the testbench or the part of the testbench to the checkpoint by running the testbench or the part of the testbench based on the recorded messages.

2. The method recited in claim 1, further comprising:
   running the emulator along with the testbench or the part of the testbench starting from the checkpoint.

3. The method recited in claim 1, wherein the testbench or the part of the testbench is a standalone software model, a set of multiple connected software models, a testbench running on a software simulator, or a system including one or more connected software models and a testbench running on a software simulator.

4. The method recited in claim 1, wherein a verification model implemented in the emulator represents a design of a processor, and the emulation operation performed by the verification model between the starting pointing and the checkpoint comprises a booting process of the processor.

5. The method recited in claim 1, further comprising:
   recording output messages transmitted from the testbench or the part of the testbench to the emulator from the starting point of the emulation operation to the checkpoint of the emulation operation; and
   comparing output messages transmitted from the testbench or the part of the testbench to the emulator during the restoring with the recorded output messages.

6. The method recited in claim 1, wherein the recorded messages do not include messages transmitted to another part of the testbench that is mapped to the emulator.

7. A system, comprising:
   an emulator and a workstation coupled to the emulator, the emulator and the workstation being configured to perform a method, the method comprising:
      recording messages transmitted from an emulator to a testbench or a part of the testbench from a starting point of an emulation operation to a checkpoint of the emulation operation, wherein the emulator is loaded with a design under verification (DUV) and the testbench or the part of the testbench is separate from the DUV and implemented by the workstation;
      capturing and storing state information of the emulator at the checkpoint, the state information comprising signal values of state elements at the checkpoint;
      configuring the emulator to a state corresponding to the checkpoint based on the stored state information; and
      restoring the testbench or the part of the testbench to the checkpoint by running the testbench or the part of the testbench based on the recorded messages.

8. The system recited in claim 7, wherein the method further comprises:
   running the emulator along with the testbench or the part of the testbench starting from the checkpoint.

9. The system recited in claim 7, wherein the testbench or the part of the testbench is a standalone software model, a set of multiple connected software models, a testbench running on a software simulator, or a system including one or more connected software models and a testbench running on a software simulator.

10. The system recited in claim 7, wherein a verification model implemented in the emulator represents a design of a processor, and the emulation operation performed by the verification model between the starting pointing and the checkpoint comprises a booting process of the processor.

11. The system recited in claim 7, wherein the method further comprises:
   recording output messages transmitted from the testbench or the part of the testbench to the emulator from the starting point of the emulation operation to the checkpoint of the emulation operation; and
   comparing output messages transmitted from the testbench or the part of the testbench to the emulator during the restoring with the recorded output messages.

12. The system recited in claim 7, wherein the recorded messages do not include messages transmitted to another part of the testbench that is mapped to the emulator.

13. A non-transitory computer readable medium comprising instructions that, when executed by a processor, cause a computing system to:
   configure an emulator to a state corresponding to a checkpoint of an emulation operation based on stored state information of the emulator, wherein the emulator is loaded with a design under verification (DUV) and the stored state information is captured and stored at the checkpoint during performing the emulation operation; and
   restore a testbench or a part of the testbench to the checkpoint by running the testbench or the part of the testbench based on recorded messages, wherein:
      the testbench or part of the testbench is separate from the DUV; and
      the recorded messages are messages transmitted from the emulator to the testbench or the part of the testbench from a starting point of the emulation operation to the checkpoint of the emulation operation and are recorded during the performing the emulation operation.

14. The non-transitory computer readable medium recited in claim 13, wherein the instructions, when executed, further cause the computing system to:
   run the emulator along with the testbench or the part of the testbench starting from the checkpoint.

15. The non-transitory computer readable medium recited in claim 13, wherein the testbench or the part of the testbench is a standalone software model, a set of multiple connected software models, a testbench running on a software simulator, or a system including one or more connected software models and a testbench running on a software simulator.

16. The non-transitory computer readable medium recited in claim 13, wherein a verification model implemented in the emulator represents a design of a processor, and the emulation operation performed by the verification model between the starting pointing and the checkpoint comprises a booting process of the processor.

17. The non-transitory computer readable medium recited in claim 13, wherein the instructions, when executed, further cause the computing system to:
   compare output messages transmitted from the testbench or the part of the testbench to the emulator during the restoring with stored output messages, the stored output messages being recorded during the performing the emulation operation.

18. The non-transitory computer readable medium recited in claim 13, wherein the recorded messages do not include messages transmitted to another part of the testbench that is mapped to the emulator.

\* \* \* \* \*